United States Patent
Kobayashi et al.

(10) Patent No.: US 9,268,028 B2
(45) Date of Patent: Feb. 23, 2016

(54) RADIATION MEASURING APPARATUS

(71) Applicants: Tatsuro Kobayashi, Chiyoda-ku (JP);
Kenichi Moteki, Osaka (JP)

(72) Inventors: Tatsuro Kobayashi, Chiyoda-ku (JP);
Kenichi Moteki, Osaka (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 708 days.

(21) Appl. No.: 13/760,462

(22) Filed: Feb. 6, 2013

(65) Prior Publication Data
US 2014/0114596 A1 Apr. 24, 2014

(30) Foreign Application Priority Data
Oct. 22, 2012 (JP) ................................. 2012-232802

(51) Int. Cl.
*H01L 27/146* (2006.01)
*G01T 1/00* (2006.01)
*G01R 19/255* (2006.01)
*G06F 15/00* (2006.01)
*G01T 1/17* (2006.01)

(52) U.S. Cl.
CPC ................ *G01T 1/00* (2013.01); *G01R 19/255* (2013.01); *G01T 1/17* (2013.01); *G06F 15/00* (2013.01)

(58) Field of Classification Search
CPC .......... G01T 1/00; G01T 1/17; G01R 19/255; G06F 15/00

USPC ...................................................... 250/370.09
See application file for complete search history.

(56) References Cited

U.S. PATENT DOCUMENTS

2013/0327940 A1* 12/2013 Nagai ....................... G01T 1/18
250/336.1

FOREIGN PATENT DOCUMENTS

| JP | 2008-215907 A | 9/2008 |
| JP | 2009-063351 A | 3/2009 |
| JP | 2012-013611 A | 1/2012 |

OTHER PUBLICATIONS

Japanese Office Action dated Nov. 17, 2015 issued in corresponding Japanese Patent Appln. No. 2012-232802, with English translation (12 pages).

* cited by examiner

*Primary Examiner* — David Porta
*Assistant Examiner* — Edwin Gunberg
(74) *Attorney, Agent, or Firm* — Buchanan Ingersoll & Rooney PC

(57) ABSTRACT

A waveform analyzing section analyzes the waveform of a detector signal pulse. A calculation section calculates a count rate from the addition-subtraction accumulated value of an up-down counter, and detects noise intrusion, based on the output from the waveform analyzing section. When noise intrusion has been detected, the addition-subtraction accumulated value for the present calculation cycle is replaced with the value for the previous calculation cycle. When the noise intrusion has stopped, the addition-subtraction accumulated value of the up-down counter is set at the value for a calculation cycle just before the noise intrusion, by an accumulated value setting circuit.

10 Claims, 8 Drawing Sheets

FIG. 5

| INDICATION VALUE | 200cpm | |
|---|---|---|
| NOISE MIXING RATE | FEATURE OF NOISE | INDIVIDUAL NOISE MIXING RATE |
| 50% | INSUFFICIENT UNDERSHOOT | 45% |
| | EXCESSIVE WAVE HEIGHT | 2% |
| | OSCILLATING WAVEFORM | 1% |
| | ABNORMAL PULSE WIDTH | 2% |

FIG. 6

| INDICATION VALUE | 200cpm | | | |
|---|---|---|---|---|
| NOISE MIXING RATE | FEATURE OF NOISE | INDIVIDUAL NOISE MIXING RATE | NOISE INTRUSION LOCATION | NOISE CAUSE |
| 50% | INSUFFICIENT UNDERSHOOT | 45% | RADIATION DETECTOR | •HIGH-VOLTAGE LINE INSULATION FAILURE (DARK CURRENT DISCHARGE NOISE)<br>•NEAR-DISCONNECTION OF HIGH-VOLTAGE LINE (DISCONNECTION NOISE)<br>•INSULATION MATERIAL PEELING OF HIGH-VOLTAGE LINE (ELECTRIC CHARGE TRANSFER NOISE) |
| | EXCESSIVE WAVE HEIGHT | 2% | | •CRACK, FRICTION, OR PEELING OF MEMBER IN DETECTOR (STATIC ELECTRICITY DISCHARGE LIGHT NOISE) |
| | OSCILLATING WAVEFORM | 1% | •RADIATION DETECTOR<br>•MEASUREMENT SECTION<br>•TRANSMISSION SECTION | •MECHANICAL VIBRATION OF DETECTOR<br>•EXOGENOUS NOISE |
| | ABNORMAL PULSE WIDTH | 2% | •POWER SUPPLY INPUT<br>•EARTHING WIRE | |

RADIATION MEASURING APPARATUS

BACKGROUND OF THE INVENTION

1. Field of the Invention

The present invention relates to a radiation measuring apparatus used for emission control or radiation control in a nuclear reactor facility, a spent nuclear fuel reprocessing facility, or the like.

2. Description of the Background Art

A radiation measuring apparatus used in a nuclear reactor facility, a spent nuclear fuel reprocessing facility, or the like is required to perform measurement so as to cover a wide range, from about 10 cpm to about $10^7$ cpm, of the repetitive frequency of a signal pulse inputted as a result of detection of radiation. Therefore, in order to eliminate discontinuity due to range switching, a count rate measurement is performed using an up-down counter that operates at a high speed over a wide range without range switching.

The above measuring method calculates a count rate by a calculation section reading in a constant cycle an addition-subtraction accumulated value when addition input and subtraction input are balanced, and particularly, has a feature of being able to measure over a range up to a high count rate. In addition, as compared to a method of calculating a count rate based on a count value measured by a counter, the above measuring method also has a feature of being able to measure with high resolution and high accuracy over the entire measurement range from a low count rate to a high count rate.

However, the counting method using an up-down counter takes a long time for recovery once noise has intruded, because the indication value returns to its original value through response by a time constant. Therefore, there is a problem that the measurement missing time until the indication has recovered to the normal state needs to be minimized.

In order to solve the problem, the following invention is disclosed. That is, noise intrusion is detected, and the last count rate is held when noise has intruded. When the noise intrusion has stopped, a backup count rate is calculated based on the count value of a counter provided in parallel with an up-down counter and the last count rate just before the entry and the backup count rate is outputted. Then, when the regular count rate based on the up-down counter has recovered to the backup count rate, the output count rate is returned to the regular count rate. Thus, increase in the indication due to noise intrusion is prevented (for example, see Patent Document 1).

In addition, the radiation measuring apparatus used in the above facilities is required to measure with constant accuracy against statistic variation unique to radiation, and to rapidly respond to the increase in the count rate. Therefore, the up-down counter operates such that a standard deviation of the count rate becomes constant over the entire measurement range and that the time constant becomes inversely proportional to the count rate, thereby balancing an addition-subtraction accumulated value. The calculation section calculates the count rate based on the addition-subtraction accumulated value.

In order to confirm that this calculation processing normally functions, the radiation measuring apparatus has a switch and a test pulse generation section. Thus, at one point equal to or higher than a high-alarm point in the entire measurement range, a test pulse having the corresponding repetitive frequency is automatically inputted, thereby enabling soundness confirmation (operation test). However, there is a problem that it takes a long time to recover from a test mode to a measurement mode.

According to this problem, the following invention is disclosed. That is, when the switch is returned from the test mode to the measurement mode, the indication value is automatically made to respond by a fast time constant until the indication value recovers to an allowable range of the stored indication value just before the test. Also in the case where the soundness confirmation is performed at a plurality of alarm set points by connecting a dedicated testing apparatus to the radiation measuring apparatus, the recovery time from the test mode to the measurement mode is reduced in the same manner (for example, see Patent Document 2).

Patent Document 1: Japanese Laid-Open Patent Publication No. 2008-215907 (Paragraphs [0040] to [0047] and FIG. 4)

Patent Document 2: Japanese Laid-Open Patent Publication No. 2009-63351 (Paragraphs [0029] to [0033] and FIG. 2)

In the invention disclosed in Patent Document 1, during recovery time of the addition-subtraction accumulated value of the up-down counter after noise intrusion, a backup count rate is calculated by using a count value of the counter obtained in a constant cycle and the backup count rate is outputted. Then, when the regular count rate based on the addition-subtraction accumulated value of the up-down counter has recovered to the backup count rate, the output count rate is returned from the backup count rate to the regular count rate. However, since the count rate responds exponentially, it takes a long time to recover to the regular count rate. Although this period is not a measurement missing time but measurement can be performed, there is a problem of temporarily losing the original feature of the up-down counter that measurement can be performed with favorable resolution and high accuracy over the entire measurement range from a low count rate to a high count rate.

In addition, in the invention disclosed in Patent Document 2, when the test mode is switched to the measurement mode to recover the indication, the recovery time is reduced by automatically switching the time constant to a fast one. However, there is a similar problem that it takes a long time for recovery because of response in an exponential manner.

SUMMARY OF THE INVENTION

The present invention has been made to solve the above problems, and an object of the present invention is to provide a radiation measuring apparatus that can measure with the resolution and accuracy of an up-down counter immediately after noise intrusion has stopped or a measurement mode is recovered from a test mode.

A radiation measuring apparatus according to the present invention includes: a radiation detector; a pulse amplifier which amplifies a detector signal from the radiation detector; a waveform analyzing section which analyzes the waveform of a detector signal pulse from the pulse amplifier, distinguishes a regular waveform and a noise waveform, and outputs the regular waveform and the noise waveform as a first digital pulse and a second digital pulse, respectively; a first counter which counts the first digital pulse; a second counter which counts the second digital pulse; an up-down counter in which the first digital pulse is inputted to an addition input and a feedback pulse is inputted to a subtraction input, and which outputs an addition-subtraction accumulated value obtained by accumulating the differences between the addition input and the subtraction input; a negative feedback pulse generation circuit which generates the feedback pulse based on the addition-subtraction accumulated value; an accumulation control circuit which specifies weighting of counting for the up-down counter; an accumulated value setting circuit which forcibly sets the addition-subtraction accumulated value of the up-down counter; and a calculation section which calculates a count rate from the addition-subtraction accumulated value of the up-down counter, and detects noise intrusion, based on count values from the first counter and the second counter. The calculation section stores the addition-subtraction accumulated value for the previous calculation cycle. When noise intrusion has been detected, the calculation section performs predetermined calculation using the addition-subtraction accumulated value for the previous calculation cycle instead of the value for the present calculation cycle and outputs the calculation result. The calculation section causes the accumulated value setting circuit to set the addition-subtraction accumulated value of the up-down counter at the value for a calculation cycle just before the noise intrusion.

Owing to the configuration as described above, the radiation measuring apparatus according to the present invention can reliably prevent increase in the indication due to noise intrusion. In addition, the radiation measuring apparatus can recover the fast operation of the up-down counter immediately after the noise intrusion has stopped or a measurement mode is recovered from a test mode.

The foregoing and other objects, features, aspects and advantages of the present invention will become more apparent from the following detailed description when read in conjunction with the accompanying drawings.

BRIEF DESCRIPTION OF THE DRAWINGS

FIG. 5 is a display example of a noise analysis result, in a radiation measuring apparatus according to the second embodiment of the present invention;

FIG. 6 is a display example of explanation of estimated noise causes, in the radiation measuring apparatus according to the second embodiment of the present invention;

DETAILED DESCRIPTION OF THE PREFERRED EMBODIMENTS OF THE INVENTION

First Embodiment

A radiation measuring apparatus of the first embodiment includes: a radiation detector; a pulse amplifier; a waveform analyzing section which analyzes the waveform of a detector signal pulse to distinguish a regular waveform and a noise waveform and outputs the regular waveform and the noise waveform to a first counter and a second counter, respectively; an up-down counter which receives, as addition input, a digital pulse from the first counter, thereby outputting an addition-subtraction accumulated value; and a calculation section which calculates a count rate based on the output from the up-down counter and detects noise intrusion, based on count values from the first counter and the second counter. When noise intrusion has been detected, the calculation section of the radiation measuring apparatus outputs a result of performing a predetermined calculation using the addition-subtraction accumulated value for the previous calculation cycle instead of the addition-subtraction accumulated value for the present calculation cycle. Then, the calculation section sets, by an accumulated value setting circuit, the addition-subtraction accumulated value of the up-down counter at the value for the calculation cycle just before the noise intrusion.

Figure 1:
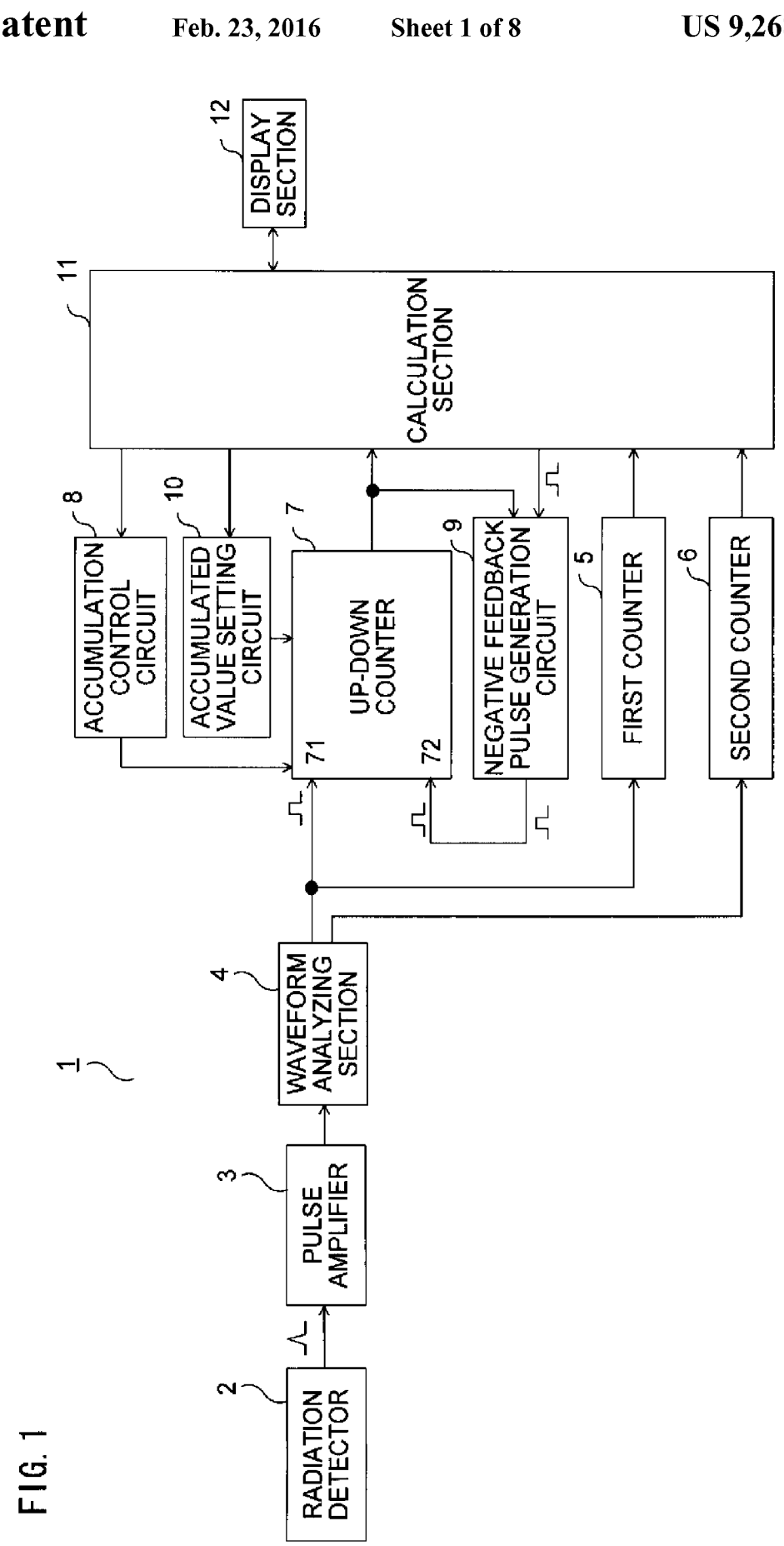
FIG. 1 is a system configuration diagram of a radiation measuring apparatus according to the first embodiment of the present invention.
Figure 2:
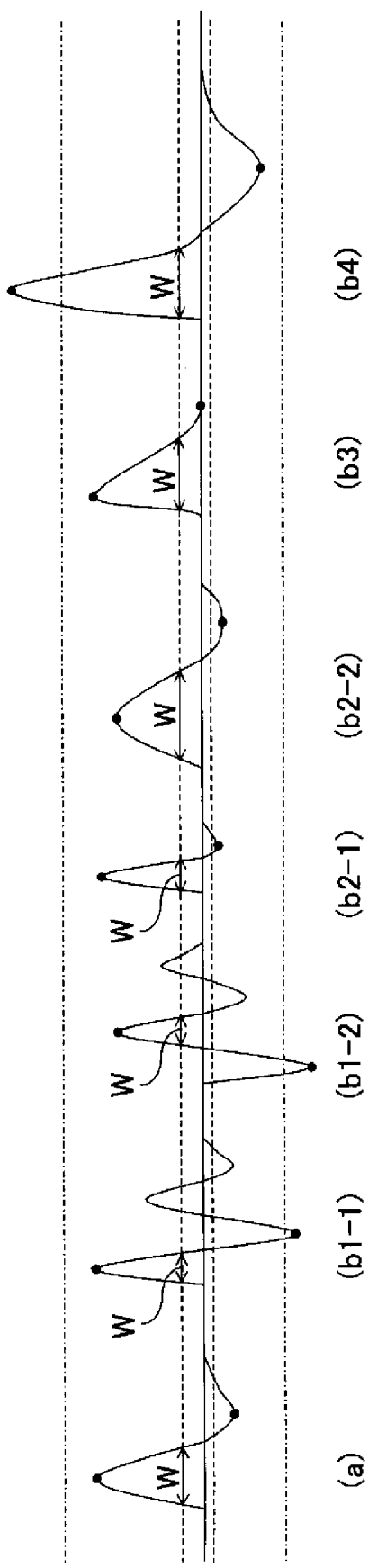
FIG. 2 is a concept explanation diagram of a noise distinguishing operation of the radiation measuring apparatus according to the first embodiment of the present invention.
Figure 3:
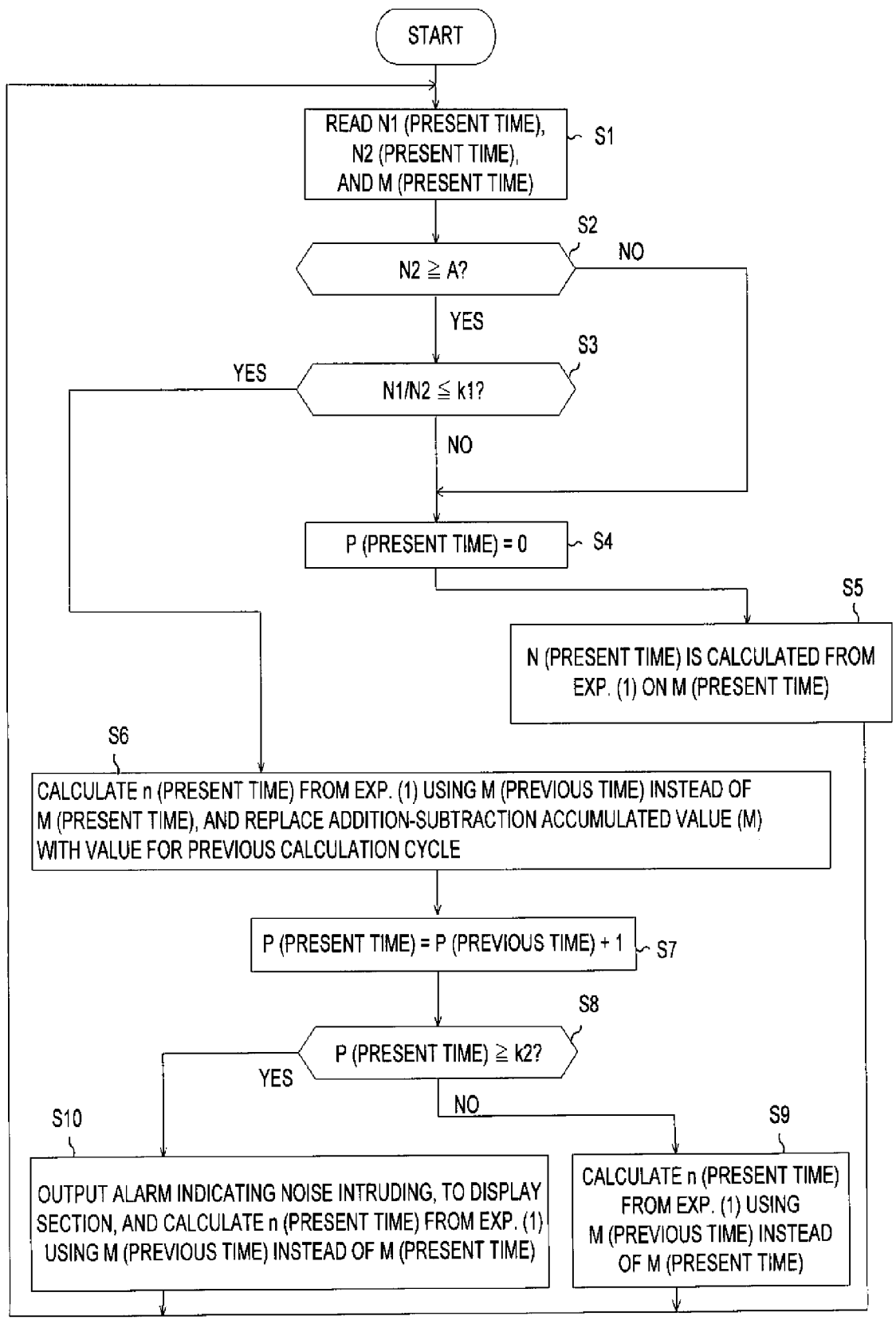
FIG. 3 is a flowchart of a noise intrusion detection process of the radiation measuring apparatus according to the first embodiment of the present invention.
Figure 4:
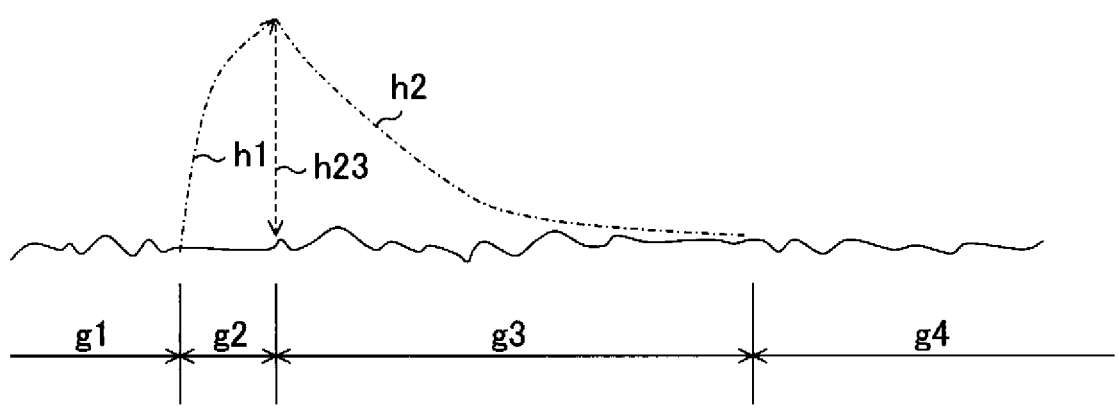
FIG. 4 is a response concept diagram of a count rate when noise has intruded, in the radiation measuring apparatus according to the first embodiment of the present invention.

Hereinafter, the configuration and operation of the first embodiment of the present invention will be described based on FIG. 1 showing a system configuration diagram of the radiation measuring apparatus, FIG. 2 showing a concept explanation diagram of a noise distinguishing operation, FIG. 3 showing a flowchart of a noise intrusion detection process, and FIG. 4 showing a response concept diagram of a count rate when noise has intruded.

First, the configuration of a radiation measuring apparatus 1 will be described, and next, the function and operation of the radiation measuring apparatus 1 will be described.

In FIG. 1, the radiation measuring apparatus 1 is composed of a radiation detector 2, a pulse amplifier 3, a waveform analysis relevant section, an up-down counter relevant section, a calculation section 11, and a display section 12. The waveform analysis relevant section is composed of a waveform analyzing section 4, a first counter 5, and a second counter 6. The up-down counter relevant section is composed of an up-down counter 7, an accumulation control circuit 8, a negative feedback pulse generation circuit 9, and an accumulated value setting circuit 10.

Next, the functions and operations of each circuit and each section will be described, and thereafter, the function and operation as a whole will be described. First, functions and operations of each circuit and each section will be described.

The radiation detector 2 detects radiation and outputs a detector signal pulse. The pulse amplifier 3 receives and amplifies the detector signal pulse, and removes high-frequency noise superimposed onto the detector signal pulse.

The waveform analyzing section 4 analyzes the waveform of the amplified detector signal pulse, distinguishes the waveform of a regular signal pulse and the waveform of a noise pulse, and outputs the regular signal pulse as a first digital pulse and the noise pulse as a second digital pulse, respectively. The first counter 5 counts the first digital pulse in a constant cycle, and the second counter 6 counts the second digital pulse in a constant cycle.

The up-down counter 7 receives the first digital pulse to be inputted to an addition input 71, and receives a feedback pulse outputted from the negative feedback pulse generation circuit 9 described later, to be inputted to a subtraction input 72, thereby outputting the resultant addition-subtraction accumulated value. The accumulation control circuit 8 performs control such that a pulse inputted to the up-down counter 7 is counted being weighted based on a standard deviation.

The negative feedback pulse generation circuit 9 receives the addition-subtraction accumulated value outputted from the up-down counter 7, and a clock pulse from the calculation section 11. Then, the negative feedback pulse generation circuit 9 generates a feedback pulse having a repetitive frequency that responds to an addition input with the first order lag of a time constant, and outputs the feedback pulse to the subtraction input 72 of the up-down counter 7.

The accumulated value setting circuit 10 forcibly sets the addition-subtraction accumulated value of the up-down counter 7.

The calculation section 11 receives the count value outputted from the first counter 5, the count value outputted from the second counter 6, and the addition-subtraction accumulated value outputted from the up-down counter 7, and calculates a count rate based on the addition-subtraction accumulated value. The calculation section 11 performs engineering value conversion and alarm determination, based on the calculated count rate, and outputs the engineering value and alarm.

In addition, the calculation section 11 detects noise intrusion, based on the count value of the first counter 5 and the count value of the second counter 6, and stores the calculation procedure and data.

Further, when noise intrusion has been detected, the calculation section 11 outputs the engineering value for the previous calculation cycle instead of the engineering value for the present calculation cycle, and causes the accumulated value setting circuit 10 to forcibly set the addition-subtraction accumulated value of the up-down counter 7 at the value for the previous calculation cycle.

The display section 12 is capable of displaying the output of the calculation section 11 and also performing setting and operation of the calculation section 11.

Next, the summary of the measuring method for a count rate using the up-down counter 7 will be described. Specifically, the response of the count rate outputted from the calculation section 11 in response to the repetitive frequency inputted to the up-down counter 7 will be described.

The up-down counter 7 receives the first digital pulse (distinguished as a regular signal pulse) having a repetitive frequency $F_{IN}$ outputted from the waveform analyzing section 4 to the addition input 71. In addition, the up-down counter 7 receives a digital pulse (feedback pulse) having a repetitive frequency $F_B$ outputted from the negative feedback pulse generation circuit 9 to the subtraction input 72. The up-down counter 7 outputs the resultant addition-subtraction accumulated value (M) to the negative feedback pulse generation circuit 9 and the calculation section 11.

The negative feedback pulse generation circuit 9 receives the addition-subtraction accumulated value (M) and outputs a digital pulse having a repetitive frequency $F_B$ (M) shown by expression (1) described later. Similarly, the calculation section 11 receives the addition-subtraction accumulated value (M) and calculates a count rate (n) by expression (1).

The calculation section 11 determines the weighting for counting of the accumulation control circuit 8, based on a set standard deviation (σ). $F_B$ (M) and n respond following $F_{IN}$ with the first order lag of a time constant (τ) so as to be equilibrium with $F_{IN}$.

Here, if n is set as a count rate, σ is set as a standard deviation, and τ is set as a time constant, there are relationships shown by the following expressions among those values.

$$F_{IN}(M) = F_B(M) = n = e^{\gamma M} = 2^{\gamma M/\ln 2} \quad (1)$$

$$\sigma = 1/(2n\tau)^{1/2} = (\gamma/2)^{1/2} \quad (2)$$

$$\tau = 1/(2n\sigma^2) \quad (3)$$

$$\gamma = 2\sigma^2 = 2^{-\gamma} \ln 2 \quad (4)$$

$$\alpha = 11 - \lambda \quad (5)$$

It is noted that γ is a relation factor of a weighting function, and α and λ are zero or positive integers.

In expression (4), for example, if λ is 11, 9, 7, and 5, the standard deviation σ is 1.3%, 2.6%, 5.2%, and 10.4%, respectively, as shown by expression (2). In expression (4), if the case of λ being 11 is a standard, when λ is 9, 7, and 5, γ is $2^2$ times, $2^4$ times, and $2^6$ times, respectively. In this case, as shown by expression (2), the standard deviation σ is $2^1$ times, $2^2$ times, and $2^3$ times, respectively. In addition, as shown by expression (3), the time constant τ is $2^{-2}$ times, $2^{-4}$ times, and $2^{-6}$ times, respectively.

As shown by expression (1), if γ becomes $2^\alpha$ times while n is constant, the addition-subtraction accumulated value (M) needs to be replaced with $2^{-\alpha}$ times thereof. However, in order that the addition-subtraction accumulated value (M) will not change even if γ is changed while n is constant, if γ becomes $2^\alpha$ times, the up-down counter 7 counts with $2^\alpha$ times of weighting for one pulse. That is, when one digital pulse outputted from the waveform analyzing section 4 is inputted to the addition input 71 of the up-down counter 7, addition counting multiplied by $2^\alpha$ is performed for the addition-subtraction accumulated value (M).

On the other hand, when one digital pulse outputted from the negative feedback pulse generation circuit 9 is inputted to the subtraction input 72 of the up-down counter 7, subtraction counting multiplied by $2^\alpha$ is performed for the addition-subtraction accumulated value (M). As a result, the addition-subtraction accumulated value (M) is a value obtained by multiplying an accumulated value N of the differences between the addition input and the subtraction input by $2^\alpha$.

Here, α is 0 or a positive integer. As shown by expression (5), if λ is 11, 9, 7, and 5, α is 0, 2, 4, and 6, respectively. For example, if λ is 11, one count is added or subtracted per input of one pulse. If λ is 9, four counts are added or subtracted per input of one pulse.

Therefore, changing γ in expression (1) to $2^\alpha$ times thereof is equivalent to changing the weighting of counting to $2^\alpha$ times. The count rate n is calculated by expression (1), based on the addition-subtraction accumulated value (M) resulting from the weighting of $2^\alpha$ times, and the value of γ corresponding to λ=11 (α=0) as a standard.

Thus, the accumulation control circuit 8 controls the weighting of counting of the up-down counter 7, whereby the standard deviation can be easily changed. In addition, even if the standard deviation is changed, the addition-subtraction accumulated value (M) does not change. Therefore, the response characteristics can be changed without changing the central value of the indication during measurement.

It is noted that expression (1) may be represented by, for example, a polygonal-line approximation, in accordance with circuit restriction or calculation processing method of the negative feedback pulse generation circuit 9 which generates a feedback pulse of output based on the addition-subtraction accumulated value from the up-down counter 7 and the clock pulse from the calculation section 11.

In the case where, for example, the engineering value is a dose rate, the calculation section 11 calculates the dose rate by multiplying the count rate by a conversion constant. In the case where the engineering value is a radioactivity concentration during the process, the calculation section 11 calculates the radioactivity concentration by multiplying, by a conversion constant, the net count rate obtained by subtracting a background count rate from a measured count rate. However, the background count rate differs depending on the placement location and time. Therefore, a count rate which is easy to be dealt with is often directly outputted without being converted to an engineering value. Hereinafter, the case where the output of the calculation section 11 is a count rate will be described as a representative example.

Next, a noise signal processing method will be described.

The waveform analyzing section 4 samples the voltage of the detector signal pulse at predetermined time intervals, arranges a predetermined number of pieces of the voltage data in time series while always updating them, and retains them as a waveform data package. If the voltage data as an analysis target exceeds a wave-height lower limit level (trigger level), the waveform analyzing section 4 takes the pieces of voltage data for a predetermined period before and after the exceeding voltage data, into the waveform data package.

For example, the voltage is measured at time intervals of 25 nsec, and the latest 200 pieces of voltage data are always transferred, thereby updating them. If the voltage value of one of the 200 pieces of voltage data exceeds a trigger level, pieces of voltage data 1 μsec before and 4 μsec after the exceeding voltage data are taken into waveform data as a package. Thus, waveform data for a total of 5 μsec before and after the data exceeding the wave-height lower limit level can be taken.

In order to increase the accuracy of waveform measurement, it is desired to decrease the time interval of the voltage measurement as much as possible.

It is noted that the trigger level is set at, for example, the lower limit level of an allowable wave-height range as a regular signal. By this setting, dark current noise, current ripple, and the like of the radiation detector 2 that are equal to or lower than the lower limit level are excluded from targets of waveform analysis, whereby efficient analysis can be performed while limiting the targets of waveform analysis.

Next, the determination criteria for distinguishing a regular signal and noise and determining the type of noise, and the analysis method for noise will be described.

The waveform analyzing section 4 performs determination and analysis by the following determination criteria, based on the maximum wave-height value, minimum wave-height value, and pulse width of waveform data.

If the maximum wave-height value exceeds an allowable upper limit value, the waveform is determined to be noise as having an excessive wave height. If the minimum wave-height value is equal to or lower than an allowable lower limit value having the opposite polarity, the waveform is determined to be noise as being oscillating waveform. If the minimum wave-height value following the maximum wave-height value is equal to or higher than an allowable upper limit value set on the opposite polarity side, the waveform is determined to be noise as causing insufficient undershoot. If the pulse width deviates from a set range, the waveform is determined to be noise as having an abnormal pulse width.

In any of the above cases, if the waveform is determined to be noise, the second digital pulse is outputted. If the waveform is not determined to be noise in any of the above determinations, the waveform is determined to be a regular signal, and the first digital pulse is outputted.

The noise analysis result for each noise waveform is outputted from the waveform analyzing section 4 to the calculation section 11 in a constant cycle.

Next, the determination method for noise intrusion performed by the calculation section 11 will be described.

The calculation section 11 determines noise intrusion, based on the count value of the first counter 5 which counts a regular signal, and the count value of the second counter 6 which counts noise. That is, if the ratio of the count value of the first counter 5 to the count value of the second counter 6 decreases to deviate from the fluctuation width defined based on the standard deviation of the count value of the first counter, it is determined that noise has intruded. In addition, if the ratio of the count value of the first counter 5 to the count value of the second counter 6 returns within the defined fluctuation width, it is determined that the noise intrusion has stopped.

In addition, the calculation section 11 receives the noise analysis result for each type of noise from the waveform analyzing section 4 in a constant cycle. Then, the calculation section 11 calculates the ratio of the number of noise pulses for each type of noise waveform to the number of noise pulses in the present calculation cycle when noise has intruded, and stores the calculated ratio as noise intrusion determination data. By request from the display section 12, the noise analysis result and the noise intrusion determination data can be displayed on the display section 12.

Next, the feature of each noise waveform distinguished by the waveform analyzing section 4 described above will be described based on FIG. 2.

In FIG. 2, a waveform (a) is the waveform of a regular signal pulse, that is, a signal waveform based on radiation. The feature of the waveform of each noise pulse relative to the waveform (a) of a regular signal pulse as a reference, is defined as a determination criterion to be used for noise determination.

It is noted that in FIG. 2, a black point indicates the maximum or minimum wave height, and W indicates a pulse width.

In FIG. 2, in a waveform (b1-1) and a waveform (b1-2), the minimum wave height exceeds a criterion level having the opposite polarity, and therefore these waveforms are determined as an oscillating waveform.

In a waveform (b2-1), the pulse width is equal to or smaller than a predetermined range, and in a waveform (b2-2), the pulse width is equal to or larger than a predetermined range. Therefore, these waveforms are determined as having an abnormal pulse width.

The above waveforms (b1-1, 2) and (b2-1, 2) are, from experience, likely to be exogenous noise which intrudes from outside into each section from the radiation detector 2 to the display section 12, or into a transmission section, a power supply input, or an earthing wire (not shown). Rarely, such noise occurs due to vibration. It is noted that noise often includes both features of the waveforms (b1-1, 2) and the waveforms (b2-1, 2).

In addition, in a waveform (b3), the undershoot does not reach a level equal to or lower than a criterion level, and therefore the waveform is determined as causing insufficient undershoot. The waveform (b3) is not relevant to the magnitude of the wave height, and is unique to noise caused by failure of an HV (HIGH VOLTAGE) signal superimposing line of the radiation detector 2.

If radiation has affected a radiation sensor (not shown) of the radiation detector 2, as a result, pulse-like current change is superimposed onto the high voltage of an HV bias power supply applied to the radiation detector 2. The current change is extracted through a capacitor removing its DC component, and is converted to a voltage pulse by a built-in preamplifier (not shown). Then, the voltage pulse is outputted as a noise pulse from the radiation detector 2.

Noise due to the HV signal superimposing line at the previous stage of the capacitor which removes a DC component is relevant to a hot line portion of the HV signal superimposing line. If a 0V common line or the like having a coat with low insulation withstand voltage contacts with the hot line, dark current discharge noise occurs. In an unstable state that a disconnection portion in the insulation coat of the HV signal superimposing line is kept in a contact and conductive state by being held by the coat, if this unstable portion repeatedly progresses into disconnected state due to temperature increase, disconnection noise occurs. In addition, when insulation material contacting the HV signal superimposing line instantaneously peels due to deterioration or the like, electric charge transfer noise occurs. The waveform (b3) is a noise waveform common among the above cases, and is a typical one of internal noise of the radiation detector 2.

Further, in a waveform (b4), the maximum wave-height value exceeds an upper level of a regular signal waveform, and therefore the waveform is determined as having an excessive wave height. Such excessive wave-height noise may be caused by cosmic ray. However, if the radiation detector 2 is shielded, such noise is hardly caused by cosmic ray.

The waveform (b4) is unique to static electricity discharge noise which occurs when static electricity discharge light, caused by friction due to vibration or split due to deterioration of insulation material inside the radiation detector 2, enters the radiation sensor. This waveform includes a waveform detected to be noise as having an excessive wave height and a waveform counted as a regular signal pulse, and has a feature of having a belt-like spectrum.

It is noted that the undershoot of this waveform is the same as that of a regular signal pulse, and cannot be distinguished. Therefore, a part of the noise signal is detected to be noise as having an excessive wave height.

Next, a noise intrusion detection process of the calculation section 11 will be described based on the flowchart in FIG. 3.

The calculation section 11 reads a count value N1 (present time) of the first counter 5 for the present calculation cycle, a count value N2 (present time) of the second counter 6 for the present calculation cycle, and the addition-subtraction accumulated value (M) (present time) of the up-down counter 7 for the present calculation cycle (S1). Next, the calculation section 11 determines whether or not N2 is equal to or higher than a determination criterion value A (N2≥A) (S2). If the determination result is NO, the process proceeds to S4. If the determination result is YES, the calculation section 11 determines whether or not the ratio of N1 (present time) to N2 (present time) is equal to or lower than an allowable lower limit value k1 (N1/N2≤k1) (S3).

If the determination result is NO, the number (here, denoted by P) of calculation cycles in which the state of N1/N2≤k1 continues is set at 0 for the present calculation cycle, that is, P (present time) is set at 0 (S4). Then, n (present time) is calculated by expression (1), based on the addition-subtraction accumulated value (M) (present time), and is outputted (S5). Then, the process returns to S1.

Here, k1 is set at 100 A/σ which is a value for determining that noise has intruded if noise increases to deviate from the fluctuation width defined based on the standard deviation σ of the count value of the first counter 5.

For example, in order to suppress the ratio of noise to a regular signal to about the standard deviation, by setting A at, for example, 2, if the standard deviation σ is, for example, 10.4%, it is determined that noise has intruded when, roughly, two or less counts of noise have been detected per 20 regular signals. Therefore, in the case of low count rate, increase in the indication can be suppressed for two or more counts of noise in a constant cycle, and in the case of high count rate, rational processing is performed so as to tolerate noise input that does not influence the indication.

From experience, if noise intrudes at a level of greatly influencing the count rate, a pseudo signal pulse is generated by multiple noise pulses (A>2) that enter abruptly and overlap in a complicated manner. The pseudo signal pulse is not distinguished as noise by the waveform analyzing section 4 but is inputted to the addition input 71 of the up-down counter 7. However, the input of the pseudo signal pulse is excluded by the determination of S3 and processing of S6 described later.

An excessive wave-height pulse, which may occur at several cpm due to cosmic ray from experience, can occur as noise having wide wave-height distribution when static electricity discharge light intrudes the radiation sensor (not shown) or a photoelectron multiplier (not shown) which converts fluorescence radiated from the radiation sensor to electron and multiplies the electron. Since such noise due to static electricity discharge light has a waveform similar to that of a signal, the presence of some pulses that appear, of excessive wave-height pulses, is detected in the determination of S3, and input of the pseudo signal pulses is excluded in the processing of S6 described later.

If the determination result of S3 is YES, the calculation section 11 calculates and outputs n (present time) by expression (1), using the addition-subtraction accumulated value (M) (previous time) for the previous calculation cycle instead of the addition-subtraction accumulated value (M) (present time) for the present calculation cycle. At the same time, the calculation section 11 causes the accumulated value setting circuit 10 to set the addition-subtraction accumulated value (M) of the up-down counter 7 at the value for the previous calculation cycle, thus forcibly replacing the addition-subtraction accumulated value (M) (S6). Further, the calculation section 11 adds 1 to P (previous time) for the previous calculation cycle, to obtain P (present time) for the present calculation cycle (S7). Next, the calculation section 11 determines whether or not P (present time)≥k2 is satisfied (S8).

If the determination result of S8 is NO, the calculation section 11 calculates and outputs n (present time) by expression (1), using the addition-subtraction accumulated value (M) (previous time) for the previous calculation cycle instead of the addition-subtraction accumulated value (M) (present time) for the present calculation cycle (S9), and the process returns to S1.

If the determination result of S8 is YES, the calculation section 11 outputs alarm indicating that noise is intruding, to the display section 12. Further, the calculation section 11 calculates and outputs n (present time) by expression (1), using the addition-subtraction accumulated value (M) (previous time) for the previous calculation cycle instead of the addition-subtraction accumulated value (M) (present time) for the present calculation cycle (S10), and the process returns to S1.

It is noted that the determination criterion value A in S2 can be set at a natural number equal to or greater than 1. Since a count rate caused by cosmic ray is small, the frequency of two counts of cosmic ray being counted in a constant cycle can be ignored in view of probability. Therefore, if A is set at 2, it is possible to prevent input signals from being discarded in an unnecessary operation of S6. In addition, the determination criterion value k2 of S8 can be set at a natural number equal to or greater than 1. For example, if k2 is set at 3, when noise has intruded in three consecutive constant cycles, it is determined that the noise intrusion is not transient, and alarm indicating that noise is intruding is outputted.

As described above, the calculation section 11 determines, in each calculation cycle, whether or not the ratio of the count value of the first counter 5 for the present calculation cycle to the count value of the second counter 6 for the present calculation cycle is equal to or lower than an allowable lower limit value, thereby detecting noise intrusion. If noise intrusion is detected, during the period in which noise is present, the calculation section 11 calculates and outputs the present count rate, based on the addition-subtraction accumulated value of the up-down counter 7 for the previous calculation cycle. At the same time, the calculation section 11 causes the accumulated value setting circuit 10 to forcibly replace the addition-subtraction accumulated value of the up-down counter 7 with the value for the previous calculation cycle, and calculates and outputs the present count rate.

Therefore, even if the up-down counter 7 causes error on counting due to a pseudo signal pulse generated by multiple noise pulses overlapping in a complicated manner, it is possible to reliably prevent increase in the indication due to noise intrusion. Further, when noise has disappeared, the high-speed operation of the up-down counter 7 can be recovered immediately.

Next, the concept of response of the count rate calculated by the calculation section 11 when noise has intruded will be described based on FIG. 4.

In FIG. 4, a period g1 indicates an initial state when noise has not intruded. A period g2 indicates a state when n (present time) is calculated using the addition-subtraction accumulated value (M) (previous time) instead of the addition-subtraction accumulated value (M) (present time) when noise has intruded. A period g3 indicates a state when, immediately after the noise intrusion is stopped, the addition-subtraction accumulated value (M) of the up-down counter 7 is forcibly replaced with the value for the previous calculation cycle and regular measurement is recovered.

It is noted that h1 indicates an assumed count rate calculated based on the addition-subtraction accumulated value (M) of the up-down counter 7 in the period g2. In addition, h2 indicates an assumed count rate calculated without setting the addition-subtraction accumulated value (M) of the up-down counter 7 at the value for the previous calculation cycle. In addition, h23 indicates change in the count rate caused as a result of setting and replacing the addition-subtraction accumulated value (M) of the up-down counter 7 with the value for the previous calculation cycle at the time of shifting from g2 to g3.

In the first embodiment, the radiation measuring apparatus 1 has the display section 12. However, even if the configuration of the radiation measuring apparatus 1 is simplified without having the display section 12, the effects are provided that increase in the indication due to noise intrusion can be reliably prevented and that, when noise intrusion has stopped, the high-speed operation of the up-down counter can be recovered immediately.

As described above, the radiation measuring apparatus according to the first embodiment includes: the radiation detector; the pulse amplifier; the waveform analyzing section which analyzes the waveform of a detector signal pulse to distinguish a regular waveform and a noise waveform and outputs the regular waveform and the noise waveform to the first counter and the second counter, respectively; the up-down counter which receives, as addition input, a digital pulse from the first counter, thereby outputting an addition-subtraction accumulated value; and the calculation section which calculates a count rate based on the output from the up-down counter and detects noise intrusion, based on count values from the first counter and the second counter. When noise intrusion has been detected, the calculation section outputs a result of performing a predetermined calculation using the addition-subtraction accumulated value for the previous calculation cycle instead of the addition-subtraction accumulated value for the present calculation cycle. Then, the calculation section sets, by an accumulated value setting circuit, the addition-subtraction accumulated value of the up-down counter at the value for the calculation cycle just before the noise intrusion. Therefore, it is possible to reliably prevent increase in the indication due to noise intrusion, and to, when noise intrusion has stopped, recover the high-speed operation of the up-down counter immediately.

Second Embodiment

A radiation measuring apparatus of the second embodiment additionally has a function of efficiently assisting noise cause investigation, based on the radiation measuring apparatus of the first embodiment.

Hereinafter, the function and operation of the second embodiment of the present invention will be described based on FIG. 5 showing a display example of a noise analysis result and FIG. 6 showing a display example of explanation of estimated noise causes.

It is noted that a system configuration diagram of the radiation measuring apparatus of the second embodiment is the same as that of the first embodiment shown in FIG. 1.

Since the radiation measuring apparatus of the second embodiment additionally has the function of efficiently assisting noise cause investigation based on the radiation measuring apparatus 1 of the first embodiment, the additional function will be mainly described.

As described in the first embodiment, the calculation section 11 receives a noise analysis result from the waveform analyzing section 4 in a constant cycle, and when the noise has intruded, calculates the ratio of the number of noise pulses for each type of noise waveform to the number of noise pulses in the present calculation cycle. The calculation section 11 stores the calculated ratio as noise intrusion determination data.

In response to request from the display section 12, the calculation section 11 sends the noise intrusion determination data to the display section 12. The display section 12 displays a noise analysis result as shown in the display example (display example of a noise analysis result and individual noise mixing rates) in FIG. 5.

Further, if an operator selects a button of a noise waveform type on the display of the ratio of the number of noise pulses for each type of noise waveform on the display section 12, the calculation section 11 sends information about noise of the selected type to the display section 12. The display section 12 displays a noise cause of each type of noise as shown in the display example (display example of estimation of noise locations and noise causes) in FIG. 6.

For example, if a button of oscillating waveform or abnormal pulse width is selected, explanation is displayed indicating that, as the noise cause, there is a high possibility that exogenous noise has intruded from outside into the transmission section, the power supply input, or the earthing wire or noise has been caused by mechanical vibration of the detector.

If a button of insufficient undershoot is selected, explanation is displayed indicating that, as the noise cause, there is a high possibility that dark current discharge noise has been caused by high-voltage line insulation failure, disconnection noise has been caused by near-disconnection of the high-voltage line, or electric charge transfer noise has been caused by peeling of insulation material of the high-voltage signal superimposing line between the anode of the photoelectron multiplier and the preamplifier input.

If a button of excessive wave height is selected, explanation is displayed indicating that, as the noise cause, in the case where the radiation detector is a scintillation detector or a Si semiconductor detector, there is a high possibility that static electricity discharge light noise has been caused by crack, friction, or peeling of a member used in the radiation detector.

In accordance with the occurrence situation of noise, an operator requests noise analysis data via the display section 12, to display explanation of a noise analysis result shown in FIG. 5 or estimated noise causes shown in FIG. 6, thereby efficiently investigating the occurrence causes of noise and taking measures for them.

In addition, for coping with the case where noise is not transient but is being caused by a noise source during a long period, the display section 12 may display alarm indicating that noise is intruding, when noise intrusion has been detected for a predetermined number or more of calculation cycles within a predetermined period. For example, when noise intrusion has been detected for a predetermined number or more of calculation cycles within a predetermined period, the calculation section 11 may automatically display a noise analysis result shown in FIG. 5 on the display section 12, thereby enabling early measures for the noise source.

As described above, the radiation measuring apparatus according to the second embodiment additionally has the function of assisting noise cause investigation. Therefore, the radiation measuring apparatus can efficiently investigate the occurrence cause of noise and take early measures.

Third Embodiment

A radiation measuring apparatus of the third embodiment is based on the radiation measuring apparatus of the first embodiment, and has a specific internal configuration of the negative feedback pulse generation circuit thereof.

Figure 7:
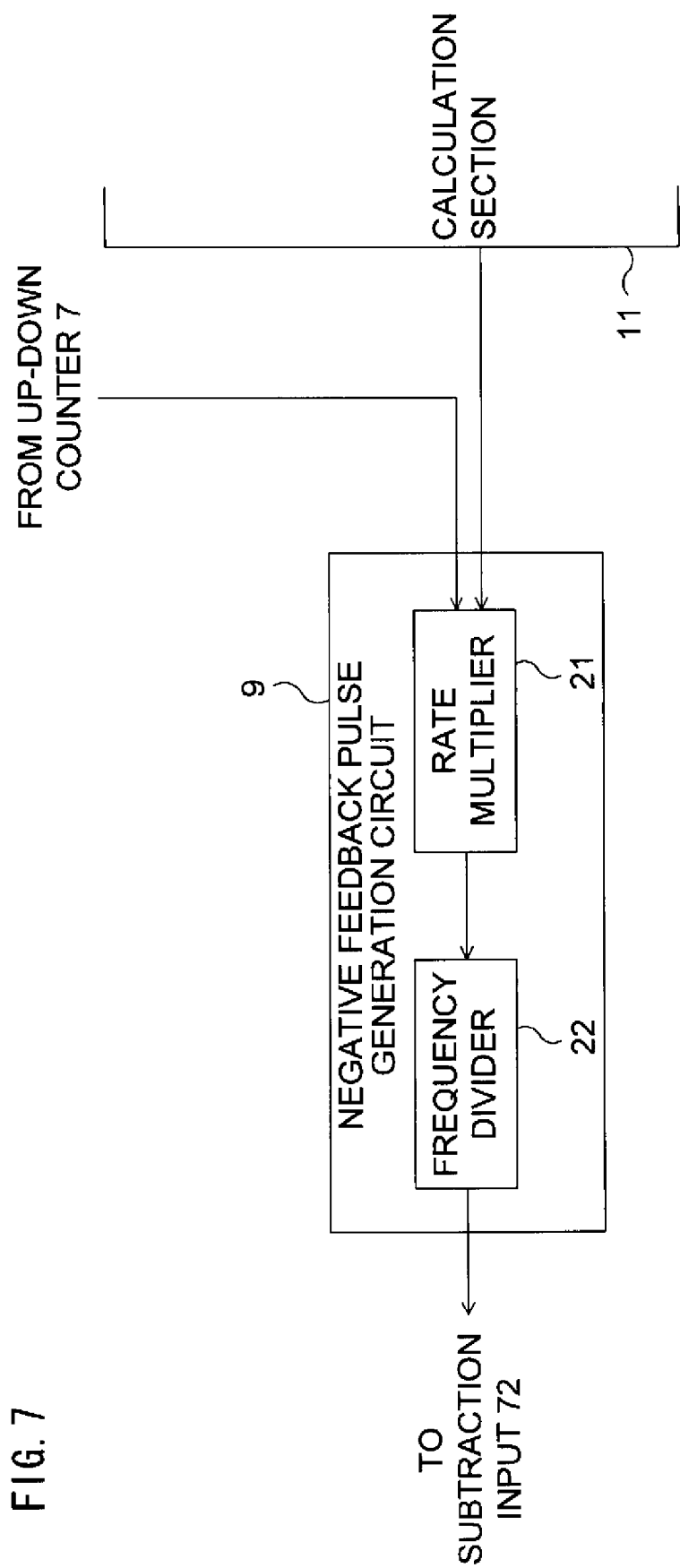
FIG. 7 is a configuration diagram of a negative feedback pulse generation circuit of a radiation measuring apparatus according to the third embodiment of the present invention.

Hereinafter, the radiation measuring apparatus of the third embodiment of the present invention will be described focusing on the configuration and operation of the negative feedback pulse generation circuit 9, based on FIG. 7 showing a configuration diagram of the negative feedback pulse generation circuit.

The negative feedback pulse generation circuit 9 has a rate multiplier 21 and a frequency divider 22, but does not have its individual clock.

The rate multiplier 21 receives the addition-subtraction accumulated value from the up-down counter 7, and a clock pulse from a clock (not shown) included in the calculation section 11, reduces the repetitive frequency of the clock pulse, based on the addition-subtraction accumulated value, and outputs the resultant value. The frequency divider 22 performs frequency-division for the output pulse of the rate multiplier 21, to reduce the repetitive frequency thereof, and outputs the resultant value as a feedback pulse.

Since the rate multiplier 21 reduces the repetitive frequency of a clock pulse based on the addition-subtraction accumulated value and then the frequency divider 22 performs frequency-division, the feedback pulse can be generated at regular intervals.

Therefore, as compared to the case of having an individual clock as in the pulse generator disclosed in Patent Document 1, digital error on the count rate due to variation in the pulse intervals can be excluded, thereby realizing highly accurate measurement.

In addition, since the output pulse of the clock included in the calculation section 11 is also used for the negative feedback pulse generation circuit, the cost can be reduced as compared to the case of having an individual clock.

As described above, in the radiation measuring apparatus according to the third embodiment, the negative feedback pulse generation circuit has the rate multiplier 21 and the frequency divider 22 without having its individual clock. Therefore, digital error on the count rate due to variation in the pulse intervals of a feedback pulse can be excluded, thereby realizing highly accurate measurement. Further, the cost can be reduced.

Fourth Embodiment

In the fourth embodiment, an indication response test function is added to the radiation measuring apparatus 1 of the first embodiment, and, when a measurement mode is recovered from a test mode, the addition-subtraction accumulated value of the up-down counter 7 is forcibly set at a stored value in the measurement mode just before the mode switching, by the accumulated value setting circuit.

Figure 8:
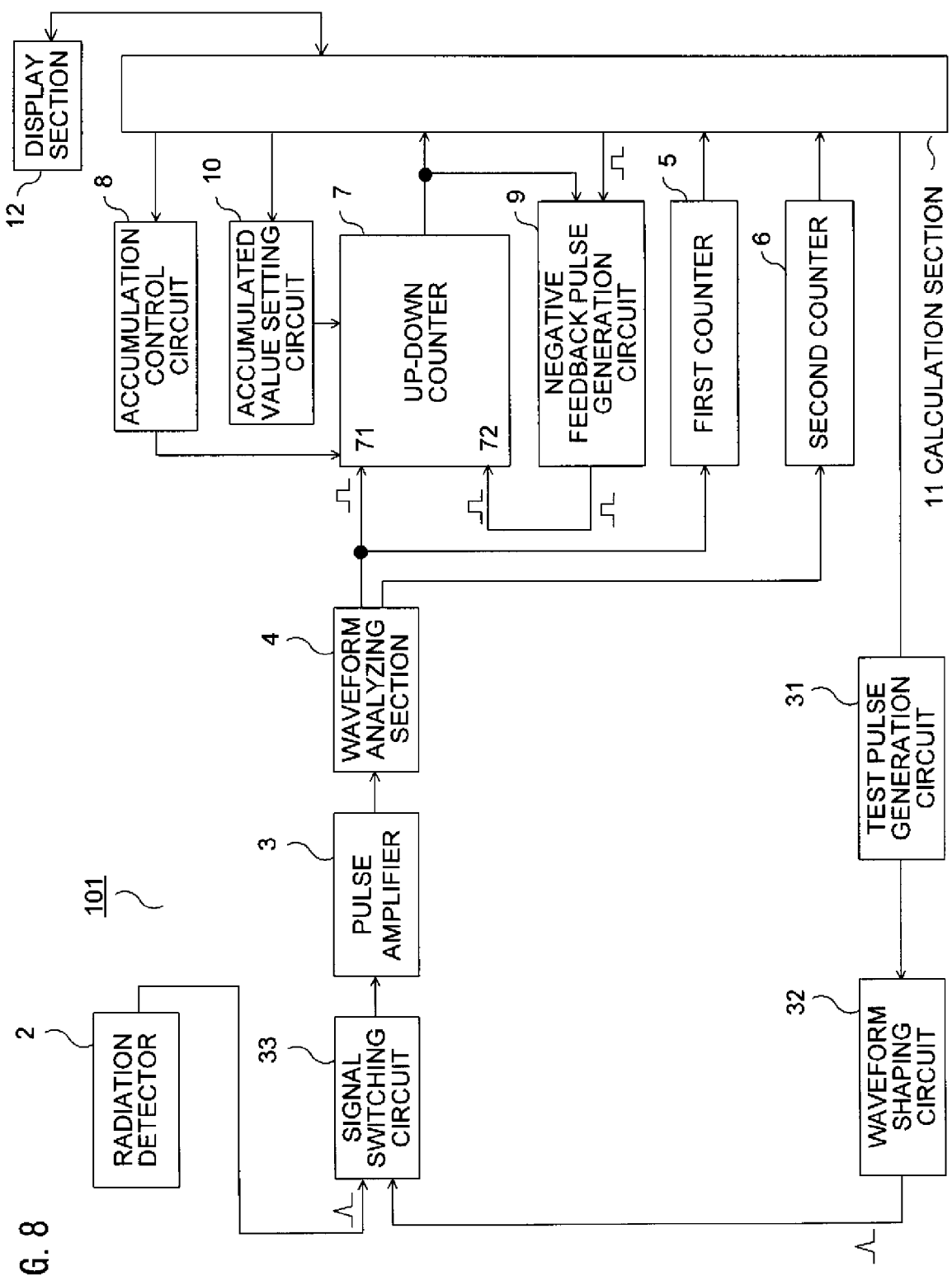
FIG. 8 is a system configuration diagram of a radiation measuring apparatus according to the fourth embodiment of the present invention.

Hereinafter, the configuration and operation of the fourth embodiment of the present invention will be described based on FIG. 8 showing a system configuration diagram of a radiation measuring apparatus 101.

In FIG. 8, components that are the same as or correspond to those in FIG. 1 are denoted by the same reference numerals.

First, in the radiation measuring apparatus 101 according to the fourth embodiment, components that are relevant to the indication response test added to the radiation measuring apparatus 1 of the first embodiment will be described.

A test pulse generation circuit 31, a waveform shaping circuit 32, and a signal switching circuit 33 are added.

The test pulse generation circuit 31 receives the output pulse of the clock (not shown) included in the calculation section 11, reduces the repetitive frequency thereof, and outputs the resultant value. The waveform shaping circuit 32 performs waveform-shaping for a test pulse from the test pulse generation circuit 31, and outputs a simulation signal pulse which simulates the detector signal pulse outputted from the radiation detector 2. The signal switching circuit 33 outputs, to the pulse amplifier 3, the simulation signal pulse from the waveform shaping circuit 32 or the detector signal pulse from the radiation detector 2 while switching the output therebetween.

Owing to the additional components that are relevant to the indication response test, the indication response test at a test point of a count rate higher than a high alarm point can be performed, including high-alarm generation confirmation.

The calculation section 11 controls the signal switching circuit 33 to switch the measurement mode in which the detector signal pulse is inputted, to the test mode in which the simulation signal pulse is inputted. When the indication response test at a fixed test point is performed, the calculation section 11 stores the addition-subtraction accumulated value in the measurement mode just before the switching.

When the indication response test is completed and then the test mode is ended to return to the measurement mode, the calculation section 11 causes the accumulated value setting circuit 10 to forcibly set the addition-subtraction accumulated value of the up-down counter 7 at a stored value in the measurement mode just before the switching.

In the case where the addition-subtraction accumulated value of the up-down counter 7 is not forcibly set, since a background count rate for the test mode has a value on the measurement range upper limit side and the time constant is inversely proportional to the count rate, it takes a long time for the count rate to recover to a background count rate in the measurement mode because the count rate decreases exponentially. On the other hand, if the addition-subtraction accumulated value is forcibly replaced with a value just before the test mode so that the count rate instantaneously returns to the background count rate in the measurement mode just before the test mode, it is possible to recover the high-speed operation of the up-down counter immediately. Further, since the output pulse of the clock included in the calculation section 11 is also used for the test pulse generation circuit, the cost can be reduced as compared to the case of having an individual clock.

As described above, in the radiation measuring apparatus 101 according to the fourth embodiment, the indication response test function is added, and when the measurement mode is recovered from the test mode, the addition-subtraction accumulated value of the up-down counter 7 is forcibly set at a stored value in the measurement mode just before the mode switching, by the accumulated value setting circuit. Therefore, after the measurement mode is recovered, the high-speed operation of the up-down counter can be recovered immediately. Further, the cost can be reduced.

It is noted that, within the scope of the present invention relating to the radiation measuring apparatus, each embodiment may be modified or abbreviated as appropriate.

Various modifications and alterations of this invention will be apparent to those skilled in the art without departing from the scope and spirit of this invention, and it should be understood that this is not limited to the illustrative embodiments set forth herein.

What is claimed is:

1. A radiation measuring apparatus comprising:
   a radiation detector;
   a pulse amplifier which amplifies a detector signal from the radiation detector;
   a waveform analyzing section which analyzes a waveform of a detector signal pulse from the pulse amplifier, distinguishes a regular waveform and a noise waveform, and outputs the regular waveform and the noise waveform as a first digital pulse and a second digital pulse, respectively;
   a first counter which counts the first digital pulse;
   a second counter which counts the second digital pulse;
   an up-down counter in which the first digital pulse is inputted to an addition input and a feedback pulse is inputted to a subtraction input, and which outputs an addition-subtraction accumulated value obtained by accumulating the differences therebetween;
   a negative feedback pulse generation circuit which generates the feedback pulse based on the addition-subtraction accumulated value;
   an accumulation control circuit which specifies weighting of counting for the up-down counter;
   an accumulated value setting circuit which forcibly sets the addition-subtraction accumulated value of the up-down counter; and
   a calculation section which calculates a count rate from the addition-subtraction accumulated value of the up-down counter, and detects noise intrusion, based on count values from the first counter and the second counter, wherein
   the calculation section stores the addition-subtraction accumulated value for the previous calculation cycle, and
   the calculation section, when noise intrusion has been detected, performs predetermined calculation using the addition-subtraction accumulated value for the previous calculation cycle instead of the value for the present calculation cycle, to output the calculation result, and causes the accumulated value setting circuit to set the addition-subtraction accumulated value of the up-down counter at the value for a calculation cycle just before the noise intrusion.

2. The radiation measuring apparatus according to claim 1, wherein
   the waveform analyzing section
      measures the voltage of the detector signal pulse at predetermined time intervals,
      retains a predetermined number of pieces of the latest data as a data package,
      at a timing of the data exceeding a wave-height lower limit level for a target of analysis, stores the data package and analyzes the maximum wave-height value, the minimum wave-height value, and the pulse width about the data package,
      if each analyzed value deviates from a determination criterion for noise, determines that the detector signal pulse is noise, and outputs the second digital pulse,
      if each analyzed value satisfies the determination criteria for noise, determines that the detector signal pulse is a regular signal, and outputs the first digital pulse, and
      outputs a noise analysis result for each noise waveform in a constant cycle.

3. The radiation measuring apparatus according to claim 2, wherein
   the determination criterion for noise includes:
      a criterion for, if the maximum wave-height value has exceeded an allowable upper limit value, determining that the detector signal pulse has an excessive wave height;
      a criterion for, if the minimum wave-height value is equal to or lower than an allowable lower limit value having the opposite polarity, determining that the detector signal pulse has an oscillating waveform;
      a criterion for, if the minimum wave-height value following the maximum wave-height value is equal to or higher than an allowable upper limit value set on the opposite polarity side, determining that the detector signal pulse causes insufficient undershoot; and
      a criterion for, if the pulse width deviates from a set range, determining that the detector signal pulse has an abnormal pulse width.

4. The radiation measuring apparatus according to claim 1, wherein
   the calculation section determines that noise has intruded, if the ratio of the count value of the first counter to the count value of the second counter has decreased to deviate from a fluctuation width determined based on a standard deviation of the count value of the first counter.

5. The radiation measuring apparatus according to claim 1, further comprising a display section which displays the output of the calculation section and performs setting and operation of the calculation section.

6. The radiation measuring apparatus according to claim 5, wherein
   the calculation section displays alarm on the display section if noise intrusion has been detected for a predetermined number or more of calculation cycles within a predetermined period.

7. The radiation measuring apparatus according to claim 5, wherein
   the calculation section
      receives the noise analysis result from the waveform analyzing section in a constant cycle,
      when the noise has intruded, calculates the ratio of the number of noise pulses for each type of noise waveform to the number of noise pulses in the present calculation cycle, and stores the latest data for a predetermined number of calculation cycles, and displays the data on the display section in response to request from the display section.

8. The radiation measuring apparatus according to claim 7, wherein
on the display of the ratio of the number of noise pulses for each type of noise waveform on the display section, if the type of noise waveform is selected, a cause for the corresponding noise is displayed on the display section.

9. The radiation measuring apparatus according to claim 5, further comprising:
a test pulse generation circuit which receives an output pulse of a clock included in the calculation section, and reduces the frequency thereof to a predetermined repetitive frequency, thereby outputting a test pulse;
a waveform shaping circuit which performs waveform-shaping for the test pulse, thereby outputting a simulation signal pulse; and
a signal switching circuit which inputs the simulation signal pulse or the detector signal pulse to the pulse amplifier while switching the input therebetween, wherein
the calculation section
controls the signal switching circuit, based on an operation signal from the display section,
performing switching between a measurement mode in which the detector signal pulse is inputted and a test mode in which the simulation signal pulse is inputted,
performs an indication response test at a predetermined test point by switching the measurement mode to the test mode,
stores the addition-subtraction accumulated value of the up-down counter in the measurement mode just before the switching to the test mode, and
when the test mode is returned to the measurement mode, causes the accumulated value setting circuit to set the addition-subtraction accumulated value of the up-down counter at the stored addition-subtraction accumulated value of the up-down counter in the measurement mode just before the switching to the test mode.

10. The radiation measuring apparatus according to claim 1, wherein the negative feedback pulse generation circuit includes:
a rate multiplier which receives the addition-subtraction accumulated value from the up-down counter and a clock pulse from the calculation section, reduces the repetitive frequency of the clock pulse, based on the addition-subtraction accumulated value, and outputs a resultant pulse; and
a frequency divider which performs frequency-division for the output pulse of the rate multiplier, thereby outputting the feedback pulse.

* * * * *

UNITED STATES PATENT AND TRADEMARK OFFICE
CERTIFICATE OF CORRECTION

PATENT NO.         : 9,268,028 B2                                        Page 1 of 1
APPLICATION NO.    : 13/760462
DATED              : February 23, 2016
INVENTOR(S)        : Kobayashi It is certified that error appears in the above-identified patent and that said Letters Patent is hereby corrected as shown below:

In the specification

Column 10, line 27, change "(56)" to --(S6)--.

Signed and Sealed this
Third Day of May, 2016

Michelle K. Lee
*Director of the United States Patent and Trademark Office*